United States Patent
Kawasaki et al.

(10) Patent No.: US 12,365,041 B2
(45) Date of Patent: Jul. 22, 2025

(54) SOLDER BALL SUPPLY DEVICE AND SOLDER BALL SUPPLY METHOD

(71) Applicant: FUJI CORPORATION, Aichi (JP)

(72) Inventors: Yuji Kawasaki, Nagoya (JP); Takehito Okada, Anjo (JP); Yusuke Yamazaki, Chiryu (JP)

(73) Assignee: FUJI CORPORATION, Aichi (JP)

( * ) Notice: Subject to any disclaimer, the term of this patent is extended or adjusted under 35 U.S.C. 154(b) by 59 days.

(21) Appl. No.: 18/551,097

(22) PCT Filed: Mar. 24, 2021

(86) PCT No.: PCT/JP2021/012222
§ 371 (c)(1),
(2) Date: Sep. 18, 2023

(87) PCT Pub. No.: WO2022/201355
PCT Pub. Date: Sep. 29, 2022

(65) Prior Publication Data
US 2024/0165727 A1 May 23, 2024

(51) Int. Cl.
*B23K 3/06* (2006.01)
(52) U.S. Cl.
CPC .................. *B23K 3/0623* (2013.01)
(58) Field of Classification Search
None
See application file for complete search history.

(56) References Cited

FOREIGN PATENT DOCUMENTS

| JP | 06344132 A | * | 12/1994 |
|----|------------|---|---------|
| JP | 2002-84061 A | | 3/2002 |
| JP | 2011-91192 A | | 5/2011 |
| JP | 2011091192 A | * | 5/2011 |
| JP | 2014-27243 A | | 2/2014 |

OTHER PUBLICATIONS

International Search Report mailed on Jun. 8, 2021 issued in PCT/JP2021/012222 filed on Mar. 24, 2021, total 2 pages.

* cited by examiner

*Primary Examiner* — Devang R Patel
(74) *Attorney, Agent, or Firm* — Oblon, McClelland, Maier & Neustadt, L.L.P.

(57) ABSTRACT

A solder ball supply device is applied to a solder ball feeder including a feeder main body section, a track member, an excitation device, and a cavity unit, and includes an imaging section and a determination section. In the supply region, the cavity unit includes multiple cavities in which one of the multiple solder balls conveyed to the supply region is to be accommodated. The imaging section causes the imaging device to image the cavity unit to which the multiple solder balls are conveyed. The determination section performs image processing on the image data of the cavity unit acquired by the imaging section to determine whether the solder ball can be collected by the component mounter for each of the multiple cavities.

9 Claims, 5 Drawing Sheets

SOLDER BALL SUPPLY DEVICE AND SOLDER BALL SUPPLY METHOD

TECHNICAL FIELD

The present description discloses a technique related to a solder ball supply device and a solder ball supply method.

BACKGROUND ART

A conductive ball supply device described in Patent Literature 1 includes a ball container, a plate-shaped ball conveyance member, and a vibration imparting means. The ball container stores conductive balls therein, and an opening portion through which the conductive balls flow out is provided in a lower portion of the ball container. The ball conveyance member is disposed below the ball container in a horizontal posture so as to maintain a predetermined gap with respect to the opening portion. The vibration imparting means imparts vibration to the ball conveyance member. The conductive ball supply device supplies the conductive balls to a supply target container by conveying the conductive balls flowing out from the opening portion of the ball container and dropping the conductive balls into the supply target container by imparting vibration to the ball conveyance member.

The control section described in Patent Literature 2 grasps, from the image information of a mounting mask received through an imaging section located above a solder ball mounting device, whether solder balls are in a completed state in which all of the solder balls are mounted on the opening portions of the mounting mask. Then, when determining that the solder balls are in an incomplete state in which not all of the solder balls are mounted, the control section inclines the mounting mask to mount the solder balls in all of the opening portions.

PATENT LITERATURE

Patent Literature 1: JP-A-2002-084061
Patent Literature 2: JP-A-2014-027243

BRIEF SUMMARY

Technical Problem

A solder ball feeder conveys multiple solder balls on a conveyance path by exciting a track member including the conveyance path, accommodates the solder balls in respective multiple cavities, and causes a component mounter to collect the solder balls. However, in the solder ball feeder, it is difficult to accommodate the solder balls in all the cavities, and the component mounter may not necessarily collect the solder balls.

In view of such a circumstance, the present description discloses a solder ball supply device and a solder ball supply method capable of recognizing a cavity in which a solder ball that can be collected by a component mounter is accommodated.

Solution to Problem

The present description discloses a solder ball supply device applied to a solder ball feeder including a feeder main body section, a track member, an excitation device, and a cavity unit, and including an imaging section and a determination section. The track member is configured to be capable of vibrating with respect to the feeder main body section and includes a conveyance path through which multiple solder balls discharged from a case are conveyed. The excitation device excites the track member to convey the multiple solder balls on the conveyance path to a supply region in which the solder ball is available for collection by a component mounter. In the supply region, the cavity unit includes multiple cavities in which one of the multiple solder balls conveyed to the supply region is to be accommodated. The imaging section causes the imaging device to image the cavity unit to which the multiple solder balls are conveyed. The determination section performs image processing on image data of the cavity unit acquired by the imaging section to determine whether the solder ball is available for collection by the component mounter for each of the multiple cavities.

In addition, the present description discloses a solder ball supply method applied to a solder ball feeder including a feeder main body section, a track member, an excitation device, and a cavity unit, and including an imaging process and a determination process. The track member is configured to be capable of vibrating with respect to the feeder main body section and includes a conveyance path through which multiple solder balls discharged from a case are conveyed. The excitation device excites the track member to convey the multiple solder balls on the conveyance path to a supply region in which the solder ball is available for collection by a component mounter. In the supply region, the cavity unit includes multiple cavities in which one of the multiple solder balls conveyed to the supply region is to be accommodated. The imaging process causes an imaging device to image the cavity unit to which the multiple solder balls are conveyed. The determination process performs image processing on image data of the cavity unit acquired by the imaging process to determine whether the solder ball is available for collection by the component mounter for each of the multiple cavities.

Advantageous Effects

According to the above-described solder ball supply device, it is possible to determine whether a solder ball can be collected by a component mounter for each of multiple cavities, and it is possible to recognize a cavity in which the solder ball that can be collected by the component mounter is accommodated. The above description of the solder ball supply device can be similarly applied to a solder ball supply method.

DESCRIPTION OF EMBODIMENTS

1. Embodiment 1-1. Configuration Example of Component Mounter 10

Figure 1:
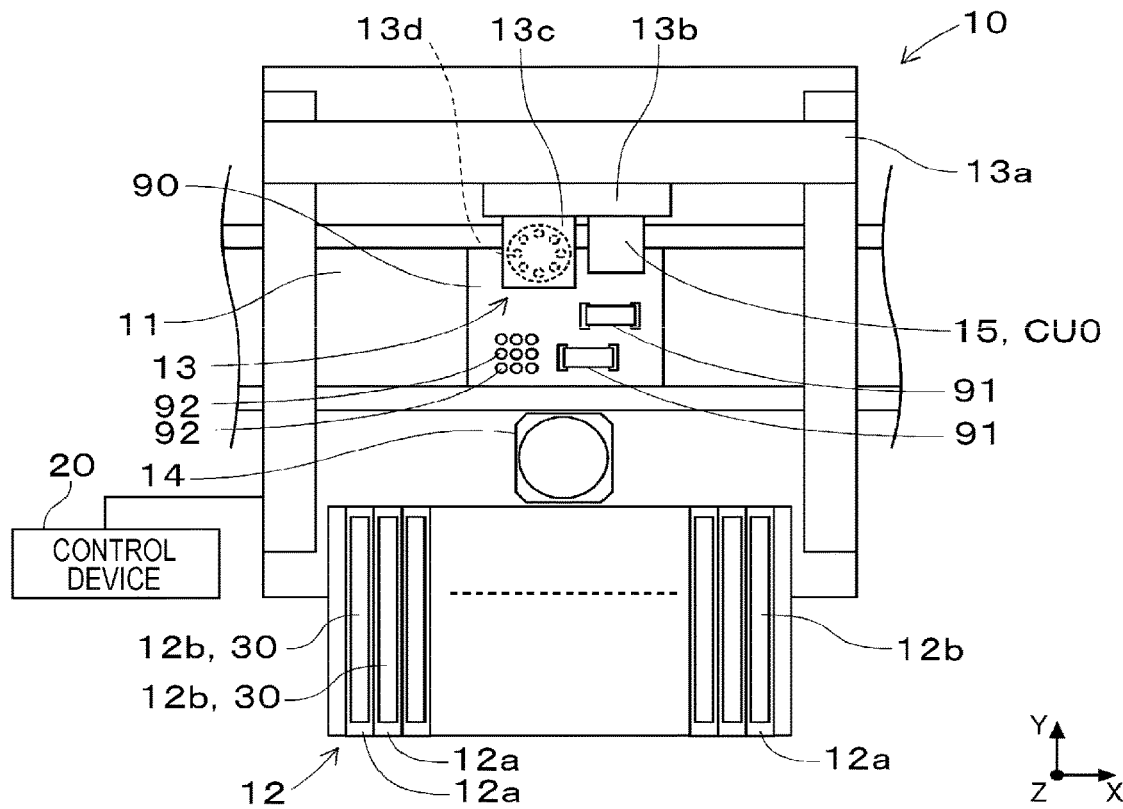
FIG. 1 is a plan view illustrating a configuration example of a component mounter.

Component mounter 10 mounts multiple components 91 on board 90. In addition, component mounter 10 can also supply multiple solder balls 92 to board 90. As illustrated in FIG. 1, component mounter 10 includes board conveyance device 11, supply device 12, transfer device 13, part camera 14, board camera 15, and control device 20.

For example, board conveyance device 11 includes a belt conveyor and the like, and conveys board 90 in a conveyance direction (X-axis direction). Board 90 is a circuit board, on which an electronic circuit, an electrical circuit, a magnetic circuit, and the like are formed. Board conveyance device 11 conveys board 90 into component mounter 10 and positions board 90 at a predetermined position in component mounter 10. After predetermined processing by component mounter 10 is completed, board conveyance device 11 conveys board 90 to the outside of component mounter 10.

Supply device 12 supplies component 91. Supply device 12 can also supply solder balls 92. Supply device 12 includes multiple feeders 12b provided along a conveyance direction (X-axis direction) of board 90. Each of multiple feeders 12b is detachably attached to slot 12a. As feeder 12b, a tape feeder, a bulk feeder, solder ball feeder 30, or the like can be used.

The tape feeder pitch-feeds a carrier tape in which multiple components 91 are housed to supply component 91 at a supply position so that component 91 can be collected. The bulk feeder supplies component 91 discharged from a case that accommodates multiple components 91 in a bulk state (a state in which the postures of multiple components 91 are irregular) so that component 91 can be collected. Solder ball feeder 30 supplies multiple solder ball 92 discharged from case 70 that accommodates solder balls 92 in a bulk state (a state in which the postures of multiple solder balls 92 are irregular) so that solder ball 92 can be collected.

In the present embodiment, solder ball feeder 30 is provided in predetermined slot 12a among multiple slots 12a of supply device 12 of component mounter 10. Slot 12a in which solder ball feeder 30 is to be provided is determined in a production plan of a board product. For example, slot 12a in which solder ball feeder 30 is to be provided is determined together with slot 12a in which other feeders 12b such as a tape feeder and a bulk feeder are to be provided so that the throughput of component mounter 10 (the production amount of a board product per unit time) is equal to or more than a predetermined value.

Transfer device 13 includes head driving device 13a, moving table 13b, mounting head 13c, and holding member 13d. Head driving device 13a is configured to move moving table 13b in the X-axis direction and a Y-axis direction (a direction orthogonal to the X-axis direction on a horizontal plane) by a linear motion mechanism. Mounting head 13c is detachably (exchangeably) provided on moving table 13b by a clamp member. Mounting head 13c uses at least one holding member 13d to collect and hold component 91 or solder ball 92 supplied by supply device 12, and mounts component 91 or solder ball 92 to board 90 positioned by board conveyance device 11. As holding member 13d, for example, a suction nozzle, a chuck, or the like can be used.

A well-known imaging device can be used as part camera 14 and board camera 15. Part camera 14 is fixed to the base of component mounter 10 so that the optical axis is directed upward in the vertical direction (in the Z-axis direction orthogonal to the X-axis direction and the Y-axis direction). Part camera 14 can image component 91 or solder ball 92 held by holding member 13d from below.

Board camera 15 is provided on moving table 13b of transfer device 13 so that the optical axis is directed downward in the vertical direction (the Z-axis direction). Board camera 15 can image board 90, cavity unit 50 described later, and the like from above. Part camera 14 and board camera 15 capture an image based on a control signal fed from control device 20. Image data of an image captured by part camera 14 and board camera 15 are transmitted to control device 20.

Control device 20 includes a well-known arithmetic device and a storage device, and constitutes a control circuit. Information, image data, and the like output from various sensors provided in component mounter 10 are input to control device 20. Control device 20 feeds a control signal to each device based on a control program, a predetermined mounting condition set in advance, and the like.

For example, control device 20 causes board camera 15 to image board 90 positioned by board conveyance device 11. Control device 20 performs image processing on the image captured by board camera 15 to recognize the positioning state of board 90. In addition, control device 20 causes holding member 13d to collect and hold component 91 supplied by supply device 12, and causes part camera 14 to image component 91 held by holding member 13d. Control device 20 performs image processing on the image captured by part camera 14 to recognize the holding posture of component 91.

Control device 20 moves holding member 13d toward the upper side of a planned mounting position set in advance by a control program or the like. In addition, control device 20 corrects the planned mounting position based on the positioning state of board 90, the holding posture of component 91, and the like, and sets the mounting position at which component 91 is actually mounted. The planned mounting position and the mounting position include a rotation angle in addition to the position (X-axis coordinate and Y-axis coordinate).

Control device 20 corrects the target position (X-axis coordinate and Y-axis coordinate) and the rotation angle of holding member 13d in accordance with the mounting position. Control device 20 lowers holding member 13d at the corrected rotation angle at the corrected target position, and mounts component 91 on board 90. Control device 20 executes mounting processing for mounting multiple components 91 on board 90 by repeating the pick-and-place cycle described above. Control device 20 may supply solder balls 92 to a predetermined region of board 90 in the same manner as component 91.

1-2. Configuration Example of Solder Ball Feeder 30

Solder ball feeder 30 may take various forms as long as solder ball feeder 30 can supply solder balls 92. As illustrated in FIGS. 2 to 6, solder ball feeder 30 of the present embodiment includes feeder main body section 31, receiving member 32, bracket 33, track member 34, lock unit 35, cover 36, shutter 37, connecting member 38, air supply device 39, excitation device 40, cavity unit 50, feeder control device 60, and case 70.

Figure 2:
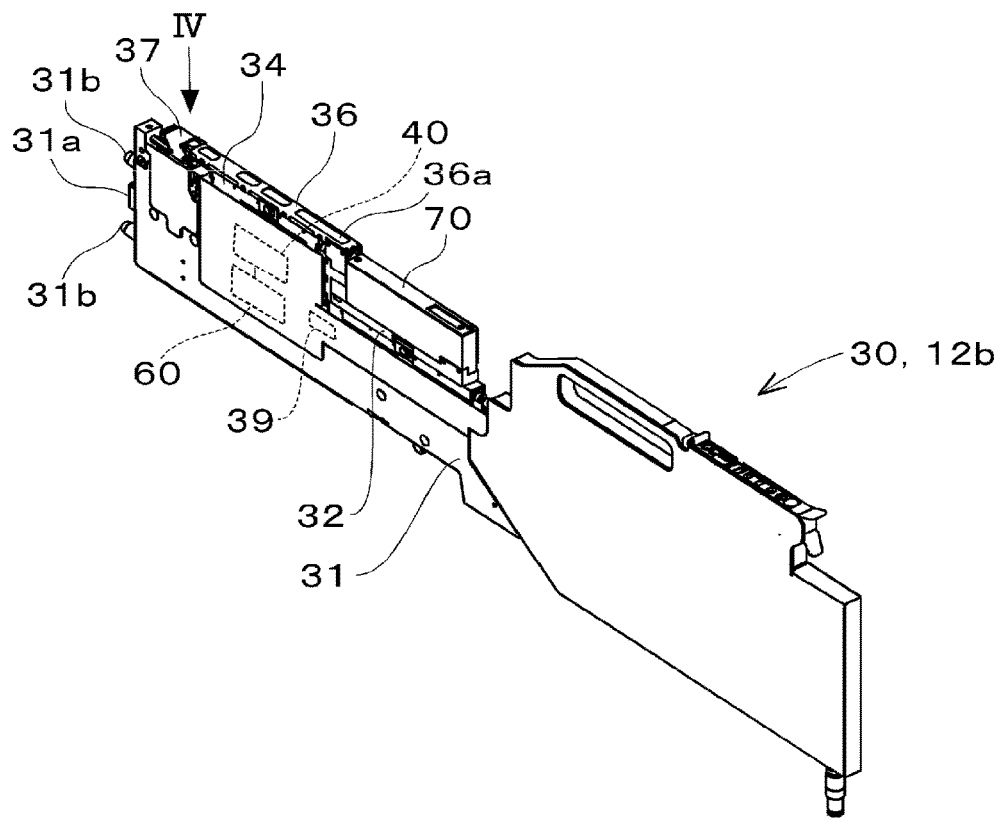
FIG. 2 is a perspective view illustrating an example of a solder ball feeder.

As illustrated in FIG. 2, feeder main body section 31 is formed in a flat box shape. Feeder main body section 31 is detachably provided in slot 12a of supply device 12. In feeder main body section 31, connector 31a and multiple (two in FIG. 2) pins 31b and 31b are formed on a tip end side in the conveyance direction of solder ball 92. Connector 31a is configured to be capable of communicating with control device 20 when feeder main body section 31 is provided in slot 12a. Solder ball feeder 30 is supplied with power via connector 31a. Multiple (two) pins 31b and 31b are inserted into guide holes provided in slot 12a, and are used for positioning when feeder main body section 31 is provided in slot 12a.

Figure 3:
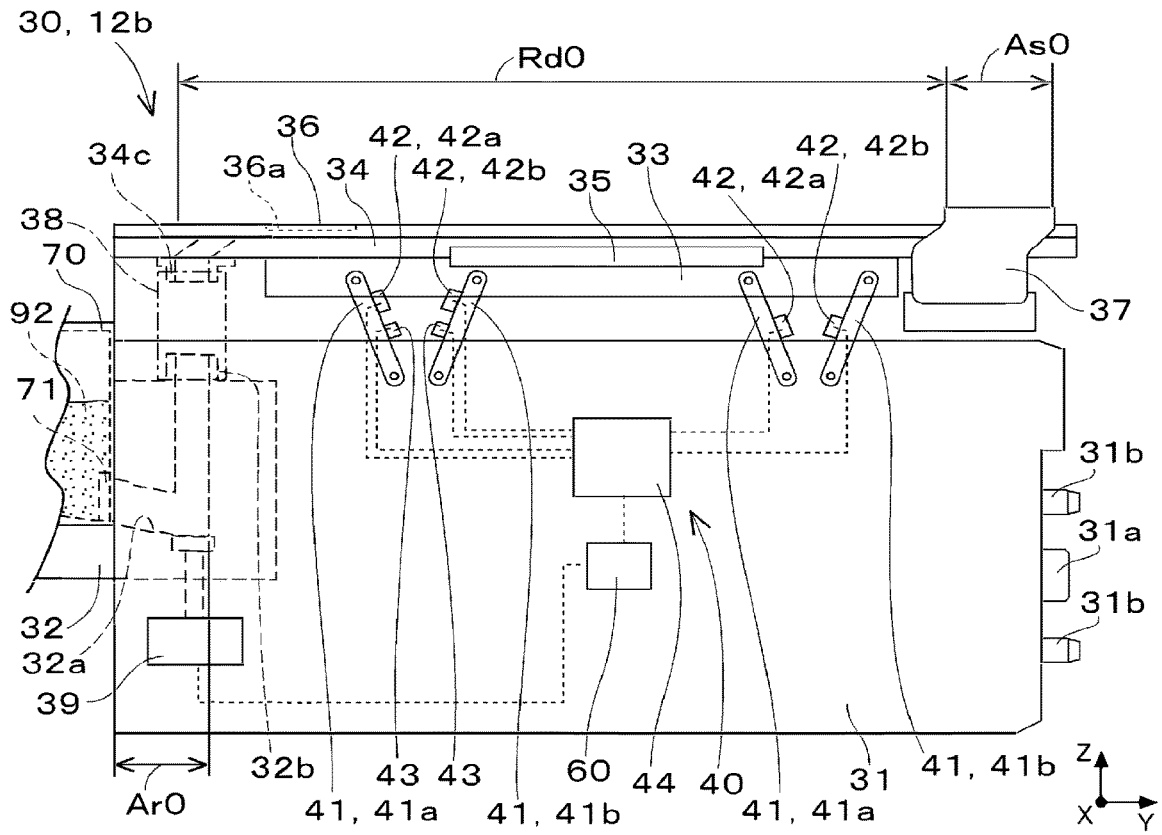
FIG. 3 is a side view schematically illustrating a part of the solder ball feeder of FIG. 2.

Case 70 for accommodating multiple solder balls 92 in a bulk state is detachably attached to feeder main body section 31 via receiving member 32. As illustrated in FIG. 3, discharge port 71 through which solder ball 92 is discharged is formed in case 70. Case 70 of the present embodiment is an external device of solder ball feeder 30. For example, an operator selects case 70 for accommodating solder balls 92 to be supplied to board 90 from multiple cases 70, and attaches selected case 70 to feeder main body section 31.

Receiving member 32 supports case 70 attached to feeder main body section 31, and is configured to be capable of vibrating with respect to feeder main body section 31. Receiving member 32 is provided in receiving region Ar0 for receiving solder ball 92 discharged from case 70. Receiving member 32 of the present embodiment includes inclined portion 32a and feeding section 32b. Inclined portion 32a is a portion inclined downward from discharge port 71 of case 70. Solder ball 92 discharged from discharge port 71 is guided downward. Feeding section 32b is a section extending upward from a tip end side of inclined portion 32a. The tip end side of feeding section 32b is opened and communicates with conveyance path Rd0 of track member 34. Solder ball 92 guided downward by inclined portion 32a is fed upward at feeding section 32b by air supply device 39 described later, and is fed to conveyance path Rd0 of track member 34.

Bracket 33 is configured to be capable of vibrating with respect to feeder main body section 31. Bracket 33 is formed in a block shape extending in the conveyance direction of solder ball 92 (corresponding to the Y-axis direction in component mounter 10 when feeder main body section 31 is provided in slot 12a). Track member 34 is attached to an upper surface of bracket 33. Bracket 33 is supported by support member 41 of excitation device 40 described later. Lock unit 35 fixes track member 34 in a state where track member 34 is attached to bracket 33. When fixed by lock unit 35, track member 34 can vibrate integrally with bracket 33 with respect to feeder main body section 31. Track member 34 is detachable from bracket 33 by the unlocking of lock unit 35.

Figure 4:
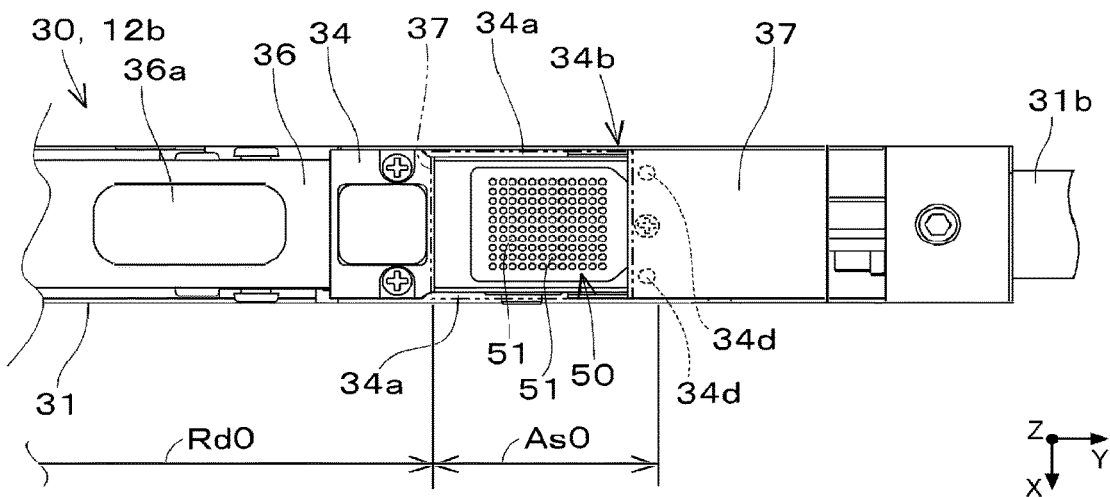
FIG. 4 is a plan view when viewed in a direction of an arrow IV in FIG. 2.
Figure 5:
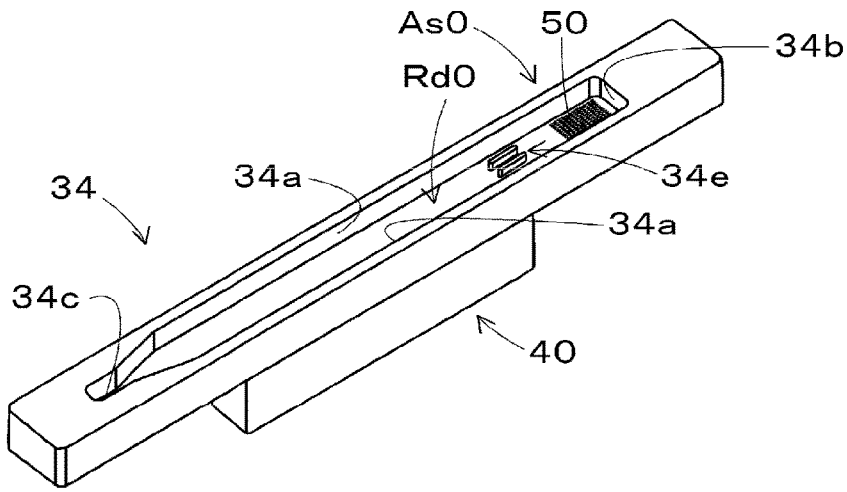
FIG. 5 is a perspective view illustrating an example of a conveyance path.

Track member 34 includes conveyance path Rd0, a pair of side walls 34a and 34a, tip end portion 34b, introduction portion 34c, at least one reference portion 34d, and guide portion 34e. Guide portion 34e may be omitted. As illustrated in FIGS. 4 and 5, track member 34 is formed to extend in a conveyance direction of solder ball 92 (the left-right direction in the drawing in FIG. 4). The pair of side walls 34a and 34a protruding upward are formed on both edges of track member 34 in the width direction (the up-down direction in the drawing in FIG. 4). In conveyance path Rd0, multiple solder balls 92 are conveyed. As described above, in the present embodiment, multiple solder balls 92 are discharged from case 70 and are fed to conveyance path Rd0 via receiving member 32.

Conveyance path Rd0 may take various forms as long as conveyance path Rd0 can convey multiple solder balls 92. As illustrated in FIG. 5, conveyance path Rd0 of the present embodiment is formed in a groove shape by the pair of side walls 34a and 34a. Specifically, the pair of side walls 34a and 34a surround the periphery of conveyance path Rd0 together with tip end portion 34b of track member 34 to suppress the leakage of multiple solder balls 92 conveyed in conveyance path Rd0. In addition, when feeder main body section 31 is provided in slot 12a, at least a part of track member 34 is disposed in supply region As0. Supply region As0 is a region in which component mounter 10 can collect solder ball 92. Specifically, supply region As0 is a region in which solder ball 92 can be collected by holding member 13d supported by mounting head 13c, and is included in the movable range of mounting head 13c.

Figure 6:
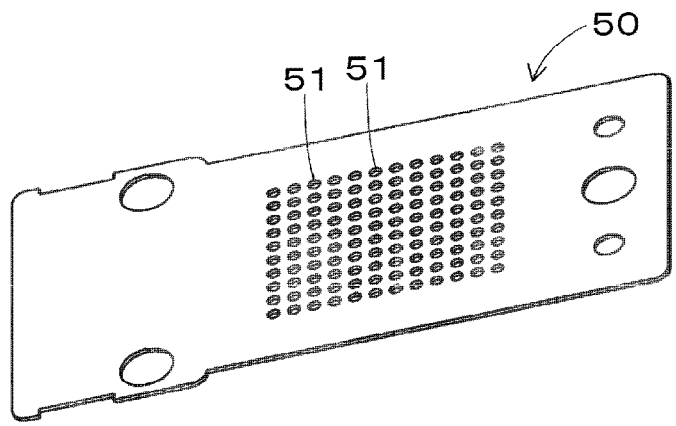
FIG. 6 is a perspective view illustrating an example of a cavity unit.

Cavity unit 50 is provided in supply region As0. Specifically, cavity unit 50 is exchangeably attached to track member 34. Cavity unit 50 includes multiple cavities 51 (120 in FIGS. 4 and 6) in which one of multiple solder balls 92 conveyed to supply region As0 is to be accommodated. In other words, each of multiple (120) cavities 51 is expected to accommodate one solder ball 92. Specifically, as illustrated in FIGS. 4 and 6, multiple (120) cavities 51 are arranged in a matrix in supply region As0. For example, cavity unit 50 includes a total of 120 cavities 51, 12 of which are arranged in the conveyance direction of solder ball 92 and 10 in the width direction of conveyance path Rd0, respectively.

Each of multiple (120) cavities 51 is opened above conveyance path Rd0 and can accommodate solder ball 92. Specifically, the opening portion of cavity 51 is formed in a circular shape and is set to a dimension slightly larger than the diameter of solder ball 92. The depth of cavity 51 is appropriately set according to the size of solder ball 92 such that cavity 51 can accommodate solder ball 92. In addition, the number of cavities 51 is appropriately set in consideration of the required number of cavities 51 and the density that may affect the conveyance property.

Specifically, the number of cavities 51 of cavity unit 50 may be set to be larger than the maximum number of solder balls 92 to be collected in one pick-and-place cycle. The maximum number corresponds to the number of holding members 13d supported by mounting head 13c. For example, in a case where mounting head 13c supports 24 suction nozzles, the number of cavities 51 may be set to be at least more than 24.

At least one reference portion 34d is provided in supply region As0 and is used when recognizing the positions of multiple cavities 51 of cavity unit 50. In the present embodiment, multiple (for example, 2) reference portions 34d and 34d are provided on the upper surface of tip end portion 34b. Multiple (2) reference portions 34d and 34d are circular marks and are disposed to be separated from each other in the width direction of track member 34. Guide portion 34e guides multiple solder balls 92 so that multiple solder balls 92 on conveyance path Rd0 are dispersed and conveyed in multiple cavities 51 of cavity unit 50. As illustrated in FIG. 5, guide portion 34e can use, for example, multiple plate-like members extending to protrude upward from the bottom surface of groove-shaped conveyance path Rd0.

Cover 36 is fixed to track member 34 and covers an upper portion of conveyance path Rd0. Multiple exhaust ports 36a are formed on an upper surface of cover 36. A mesh having a joint smaller than the outer dimension of solder ball 92 is stretched over exhaust port 36a. Cover 36 can suppress the protruding of solder balls 92 from conveyance path Rd0 and discharge air to the outside from exhaust port 36a.

Shutter 37 is provided above track member 34 and can close the opening of supply region As0. Solder ball feeder 30 can suppress the protruding of solder balls 92, the mixing of foreign matter in supply region As0, and the like by opening and closing shutter 37. Shutter 37 of the present embodiment is switched to an open state, a closed state, or an intermediate state by an opening and closing operation. The closed state of shutter 37 is a state in which shutter 37 contacts track member 34 and the opening of supply region As0 is completely closed. At this time, as indicated by dashed lines in FIG. 4, shutter 37 is located on the proximal end side in the conveyance direction of solder ball 92 with respect to multiple (2) reference portions 34d and 34d in track member 34, and multiple (2) reference portions 34d and 34d can be visually recognized and imaged in the upward view.

The open state of shutter 37 is a state in which the opening of supply region As0 is not closed and cavity unit 50 is exposed. At this time, holding member 13d supported by mounting head 13c can attempt to collect solder ball 92 for any of multiple cavities 51 of cavity unit 50. The intermediate state of shutter 37 is a state between the closed state and the opened state, in which shutter 37 is separated from track member 34 with respect to the amplitude of track member 34 that is vibrated by the excitation of excitation device 40, and in which the protruding of solder balls 92 from the opening of supply region As0 is regulated. Shutter 37 is opened and closed by a driving device, and is placed in the closed state, the opened state, or the intermediate state according to the driving state of the driving device.

Introduction portion 34c of track member 34 communicates with feeding section 32b of receiving member 32, and feeds solder ball 92 fed from feeding section 32b to conveyance path Rd0. Specifically, a tip end portion of introduction portion 34c is opened and is connected to a tip end portion of feeding section 32b via connecting member 38. Connecting member 38 is formed in a tubular shape, and connects feeding section 32b of receiving member 32 and introduction portion 34c of track member 34. Connecting member 38 of the present embodiment is a tight coil spring and has flexibility.

Connecting member 38 connects feeding section 32b of receiving member 32 and introduction portion 34c of track member 34 so that multiple solder balls 92 can flow between receiving region Ar0 and conveyance path Rd0. In addition, connecting member 38 absorbs the vibrations by deforming in response to the vibrations of receiving member 32 and the vibrations of track member 34 with respect to feeder main body section 31. Connecting member 38 alleviates or blocks vibration transmitted between receiving member 32 and track member 34 that vibrate independently of each other.

Air supply device 39 supplies air (positive pressure air) from a lower side of receiving region Ar0 so that multiple solder balls 92 are caused to flow from receiving member 32 to track member 34 via connecting member 38. Air supply device 39 of the present embodiment supplies positive pressure air supplied from the outside from the lower side of receiving region Ar0 based on a command of feeder control device 60 described later. Air supply device 39 can also block the supply of the positive pressure air based on a command from feeder control device 60.

When air supply device 39 supplies the positive pressure air, multiple solder balls 92 remaining in receiving region Ar0 are blown upward by the positive pressure air. The positive pressure air and multiple solder balls 92 flow through feeding section 32b of receiving member 32, connecting member 38, and introduction portion 34c in this order, and reach conveyance path Rd0 of track member 34. The positive pressure air reaching conveyance path Rd0 is exhausted to the outside from exhaust port 36a of cover 36. Multiple solder balls 92 that have reached conveyance path Rd0 drop into conveyance path Rd0 of track member 34 by the own weight thereof.

Excitation device 40 excites track member 34 to convey multiple solder balls 92 on conveyance path Rd0 to supply region As0 where multiple solder balls 92 can be collected by component mounter 10. Excitation device 40 may take various forms as long as excitation device 40 can convey multiple solder balls 92 to supply region As0. Excitation device 40 of the present embodiment includes multiple (for example, 4) support members 41, multiple (for example, 4) vibrators 42, multiple (for example, 2) vibration sensors 43, and power supply device 44. Multiple (4) support members 41 connect feeder main body section 31 and bracket 33 to support bracket 33 and track member 34.

In addition, multiple (4) support members 41 include two types of support members 41, forward movement support member 41a and rearward movement support member 41b. Forward movement support member 41a is used for forward movement conveyance control for conveying multiple solder balls 92 in a direction toward cavity unit 50 (forward direction) in conveyance path Rd0. Rearward movement support member 41b is used for rearward movement conveyance control for conveying multiple solder balls 92 in a direction toward case 70 (rearward direction) in conveyance path Rd0. The inclination directions of forward movement support member 41a and rearward movement support member 41b with respect to the vertical direction (the Z-axis direction) are different from each other.

Specifically, a first end side of forward movement support member 41a is connected to feeder main body section 31, and a second other end side of forward movement support member 41a is connected to bracket 33. Forward movement support member 41a is inclined in the rearward direction with respect to the vertical direction (the Z-axis direction). In addition, a first end side of rearward movement support member 41b is connected to feeder main body section 31, and a second end side of rearward movement support member 41b is connected to bracket 33. Rearward movement support member 41b is inclined in the forward direction with respect to the vertical direction (the Z-axis direction).

Multiple (4) vibrators 42 are supplied with power from power supply device 44 and vibrate at a predetermined amplitude and frequency. Multiple (4) vibrators 42 can use, for example, a piezoelectric element, and are attached to support member 41. In addition, in the present embodiment, since multiple (4) support members 41 include two types of support members 41, forward movement support member 41a and rearward movement support member 41b, multiple (4) vibrators 42 include two types of vibrators 42, forward movement vibrator 42a provided in forward movement support member 41a and rearward movement vibrator 42b provided in rearward movement support member 41b.

At least one of multiple (4) vibrators 42 vibrates to impart vibration to track member 34 via bracket 33. In addition, the amplitude and the frequency of the vibration imparted to track member 34 vary in accordance with the voltage and the frequency of the AC power supplied to vibrator 42. Multiple (2) vibration sensors 43 detect the vibration state of track member 34 excited by excitation device 40. Multiple (2) vibration sensors 43 can detect, for example, the amplitude, frequency, decay time, vibration trajectory (movement trajectory of a specific portion caused by the vibration) of the vibration of track member 34, and the like. In the present embodiment, multiple (2) vibration sensors 43 are provided on each of the pair of forward movement support member 41a and rearward movement support member 41b.

When excitation device 40 excites track member 34, track member 34 makes an elliptical motion in the side view. As a result, an external force in the forward direction and the upward direction or an external force in the rearward direction and the upward direction is applied to multiple solder balls 92 on conveyance path Rd0 in accordance with the rotational direction of the elliptical motion of track member 34. As a result, multiple solder balls 92 on the conveyance path Rd0 are conveyed in the forward direction or the rearward direction.

Power supply device 44 changes the voltage and the frequency of the AC power supplied to vibrator 42 based on a command of feeder control device 60. As a result, the amplitude and the frequency of the vibration imparted to track member 34 are adjusted so that the rotational direction of the elliptical motion of track member 34 is defined. When the amplitude, frequency, and rotational direction of the elliptical motion caused by the vibration of track member 34 change, the conveyance speed, degree of dispersion, conveyance direction, and the like of solder ball 92 to be conveyed change.

Feeder control device 60 includes a well-known arithmetic device and a storage device, and constitutes a control circuit. Feeder control device 60 is powered via connector 31a in a state in which feeder main body section 31 is provided in slot 12a so that feeder control device 60 is placed in a state capable of communicating with control device 20 of component mounter 10. Feeder control device 60 drives and causes excitation device 40 to excite track member 34 so that multiple solder balls 92 on conveyance path Rd0 are conveyed.

1-3. Configuration Example of Solder Ball Supply Device 80

Solder ball feeder 30 excites track member 34 including conveyance path Rd0, thereby conveying multiple solder balls 92 on conveyance path Rd0, accommodating solder balls 92 in each of multiple cavities 51, and causing component mounter 10 to collect solder balls 92. However, in solder ball feeder 30, it is difficult to accommodate solder balls 92 in all cavities 51 of cavity unit 50, and component mounter 10 may not necessarily collect solder balls 92.

Figure 7:
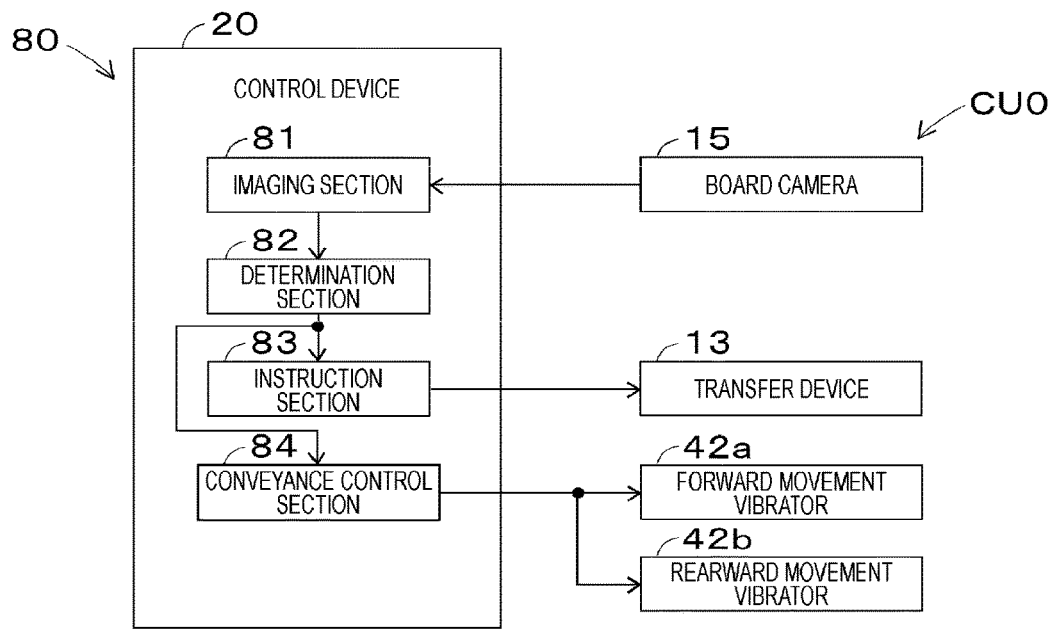
FIG. 7 is a block view illustrating an example of a control block of a solder ball supply device.

Therefore, in the present embodiment, solder ball supply device 80 is provided. Solder ball supply device 80 is applied to solder ball feeder 30 including feeder main body section 31, track member 34, excitation device 40, and cavity unit 50. Solder ball supply device 80 includes imaging section 81 and determination section 82 when viewed as a control block. Solder ball supply device 80 may also include instruction section 83. Solder ball supply device 80 may also include conveyance control section 84. As illustrated in FIG. 7, solder ball supply device 80 according to the present embodiment includes imaging section 81, determination section 82, instruction section 83, and conveyance control section 84.

Solder ball supply device 80 can be provided, for example, in control device 20 of component mounter 10. In addition, solder ball supply device 80 may be provided in a control device other than component mounter 10. In addition, solder ball supply device 80 may be formed on a cloud. As illustrated in FIG. 7, solder ball supply device 80 according to the present embodiment is provided in control device 20 of component mounter 10.

Figure 8:
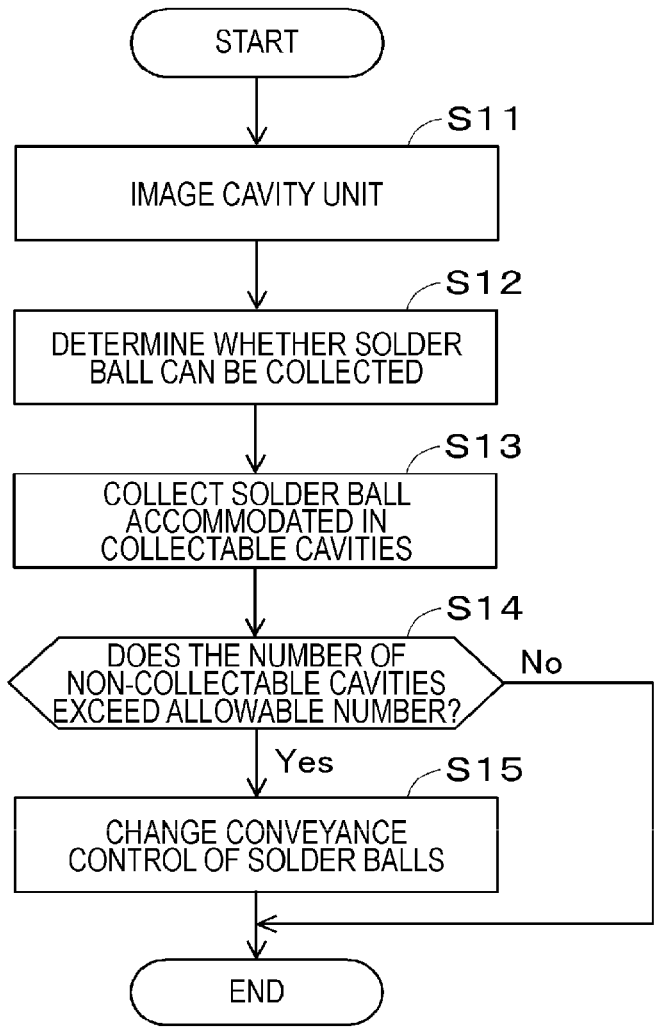
FIG. 8 is a flowchart illustrating an example of a control procedure by a solder ball supply device.

In addition, solder ball supply device 80 executes control according to the flowchart illustrated in FIG. 8. Imaging section 81 performs the processing illustrated in step S11. Determination section 82 performs the processing illustrated in step S12. Instruction section 83 performs the processing illustrated in step S13. Conveyance control section 84 performs the determination illustrated in step S14 and the processing in step S15.

1-3-1. Imaging Section 81 and Determination Section 82

Imaging section 81 causes imaging device CU0 to image cavity unit 50 on which multiple solder balls 92 are conveyed (step S11 illustrated in FIG. 8). Determination section 82 performs image processing on image data PD0 of cavity unit 50 acquired by imaging section 81, and determines whether solder ball 92 can be collected by component mounter 10 for each of multiple cavities 51 (step S12).

As imaging device CU0, a well-known imaging device can be used as long as cavity unit 50 can be imaged. As imaging device CU0, for example, board camera 15 can be used. Board camera 15 images at least a part of cavity 51 included in cavity unit 50 from above. In a case where it is difficult to image all cavities 51 included in cavity unit 50 at once, board camera 15 can divide cavity unit 50 into multiple regions to image at least one cavity 51 for each of the divided regions.

As described above, at least one reference portion 34d (in the present embodiment, multiple (2) reference portions 34d and 34d) used when recognizing the positions of multiple cavities 51 of cavity unit 50 is provided in supply region As0. Multiple (2) reference portions 34d and 34d can be visually recognized and imaged in the closed state of shutter 37. Accordingly, imaging section 81 instructs feeder control device 60 to close shutter 37. As a result, board camera 15 can image multiple (2) reference portions 34d and 34d from above.

Imaging section 81 moves board camera 15 above multiple (2) reference portions 34d and 34d so that board camera 15 images multiple (2) reference portions 34d and 34d. Determination section 82 performs image processing on image data PD0 of cavity unit 50 acquired by imaging section 81, and recognizes the position of supply region As0 in component mounter 10 based on the positions of multiple (2) reference portions 34d and 34d and the position of board camera 15 when multiple (2) reference portions 34d and 34d are imaged.

Control device 20 instructs solder ball feeder 30 to convey solder ball 92 before component mounter 10 collects solder ball 92. As a result, solder ball feeder 30 discharges solder ball 92 from case 70 as required, and causes solder ball 92 to flow to track member 34. Solder ball feeder 30 maintains shutter 37 in the intermediate state to convey multiple solder balls 92 to supply region As0 on conveyance path Rd0. As a result, multiple solder balls 92 are conveyed to cavity unit 50.

Multiple cavities 51 of cavity unit 50 can be visually recognized and imaged in the open state of shutter 37. Therefore, imaging section 81 instructs feeder control device 60 to place shutter 37 in the open state when causing board camera 15 to image cavity unit 50 to which multiple solder balls 92 are conveyed. As a result, board camera 15 can image cavity unit 50 from above.

Figure 9:
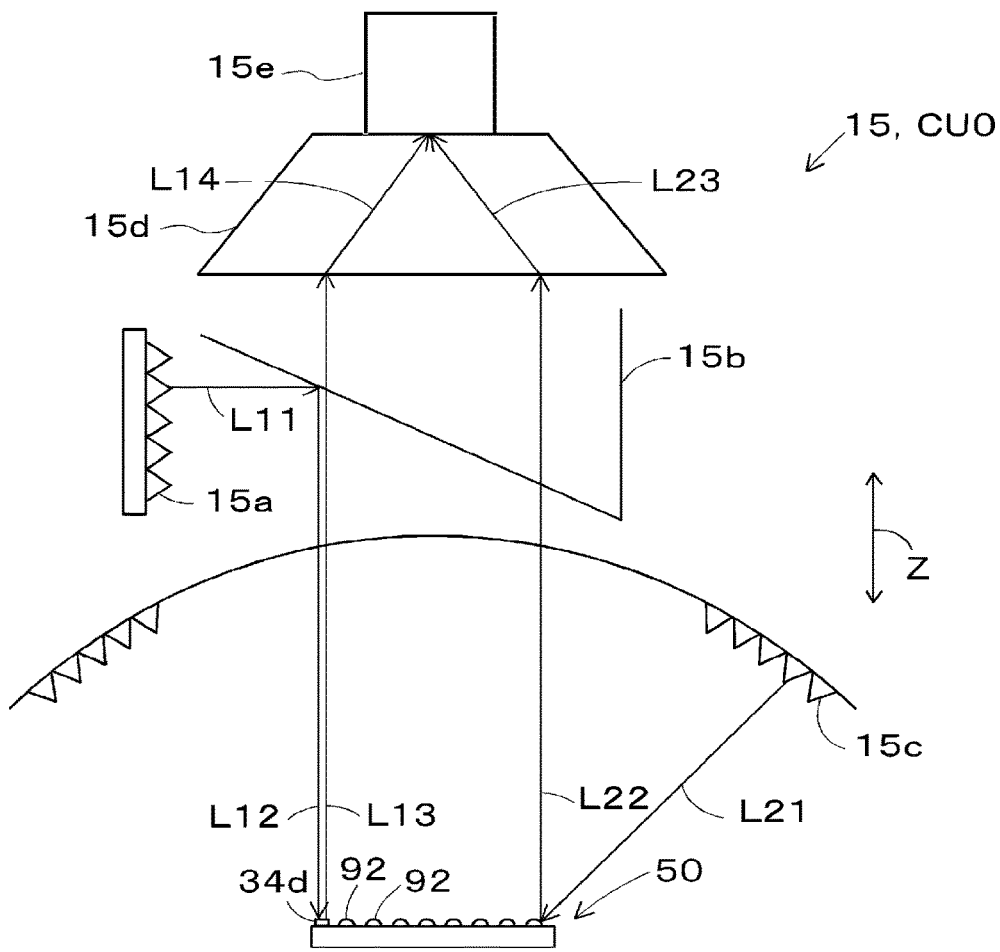
FIG. 9 is a side view illustrating a configuration example of an imaging device.

In addition, multiple (2) reference portions 34d and 34d are often provided to be recognized by being lighted by incident light, and solder ball 92 is easily recognized by being lighted by oblique light. Therefore, as illustrated in FIG. 9, in the present embodiment, board camera 15 that is imaging device CU0 includes reference portion light source 15a, incident light converting section 15b, and solder ball light source 15c. Reference portion light source 15a is a light source for lighting reference portion 34d. Incident light converting section 15b converts the irradiation light irradiated from reference portion light source 15a into incident light to light reference portion 34d from above in the vertical direction (the Z-axis direction).

Solder ball light source 15c is a light source for lighting multiple solder balls 92 of cavity unit 50 from an obliquely upper side inclined by a predetermined angle with respect to the vertical direction (the Z-axis direction). The predetermined angle is an angle capable of recognizing solder ball 92, and is set in advance by simulation, verification by an actual machine, or the like. As reference portion light source 15a and solder ball light source 15c, for example, a well-known light emitting diode can be used, and the wavelength of the irradiation light is not limited. As incident light converting section 15b, for example, a half mirror can be used.

Reference portion light source 15a irradiates incident light converting section 15b with light (arrow L11). The irradiation light irradiated from reference portion light source 15a is reflected by incident light converting section 15b and travels toward reference portion 34d (arrow L12). The reflection angle is set to 90°. The irradiation light reflected by reference portion 34d travels toward lens 15d (arrow L13). The irradiation light reaching lens 15d passes through lens 15d and travels toward imaging element 15e (arrow L14).

In addition, solder ball light source 15c irradiates multiple solder balls 92 with light from an obliquely upper side inclined by a predetermined angle with respect to the vertical direction (the Z-axis direction) (arrow L21). The irradiation light reflected by multiple solder balls 92 travels toward lens 15d (arrow L22). The irradiation light reaching lens 15d passes through lens 15d and travels toward imaging element 15e (arrow L23).

As described above, imaging section 81 acquires image data PD0 of reference portion 34d captured by lighting reference portion 34d by using reference portion light source 15a and incident light converting section 15b, and image data PD0 of multiple solder balls 92 captured by lighting multiple solder balls 92 by using solder ball light source 15c, respectively. In this case, determination section 82 can recognize multiple solder balls 92 of cavity unit 50 with reference to reference portion 34d based on image data PD0 of reference portion 34d and image data PD0 of multiple solder balls 92 to determine whether solder balls 92 can be collected.

Determination section 82 can determine whether solder ball 92 can be collected by component mounter 10 from various viewpoints. For example, determination section 82 can determine whether solder ball 92 can be collected by component mounter 10 based on the presence or absence of solder ball 92. In this case, determination section 82 can determine cavity 51 in which solder ball 92 is accommodated as cavity 51 in which solder ball 92 can be collected by component mounter 10, and can determine cavity 51 in which solder ball 92 is not accommodated as cavity 51 in which solder ball 92 cannot be collected by component mounter 10.

Determination section 82 may also determine whether solder ball 92 can be collected by component mounter 10 based on whether solder ball 92 is appropriately accommodated in cavity 51. In this case, determination section 82 can determine cavity 51 in which solder ball 92 is appropriately accommodated as cavity 51 in which solder ball 92 can be collected by component mounter 10, and can determine cavity 51 in which solder ball 92 is not appropriately accommodated as cavity 51 in which solder ball 92 cannot be collected by component mounter 10.

For example, determination section 82 performs image processing on image data PD0 of cavity unit 50 to recognize solder ball 92. Determination section 82 compares the recognition region of solder ball 92 recognized in image data PD0 with a planned region in which solder ball 92 is to be recognized in image data PD0, thereby determining whether solder ball 92 is appropriately accommodated in cavity 51. Specifically, determination section 82 determines that solder ball 92 is appropriately accommodated in cavity 51 when a specific amount (for example, at least one of an area, an outer peripheral length, a shape, and the like) that specifies the recognition region of solder ball 92 is included in the allowable range of the specific amount of the planned region.

Determination section 82 determines that solder ball 92 is not appropriately accommodated in cavity 51 when the specific amount of the recognition region of solder ball 92 is not included in the allowable range of the specific amount of the planned region. Determination section 82 can also determine the presence or absence of solder ball 92 for each of multiple cavities 51, and determine whether solder ball 92 is appropriately accommodated in cavity 51 for cavity 51 determined to accommodate solder ball 92, thereby determining whether solder ball 92 can be collected by component mounter 10.

Figure 10:
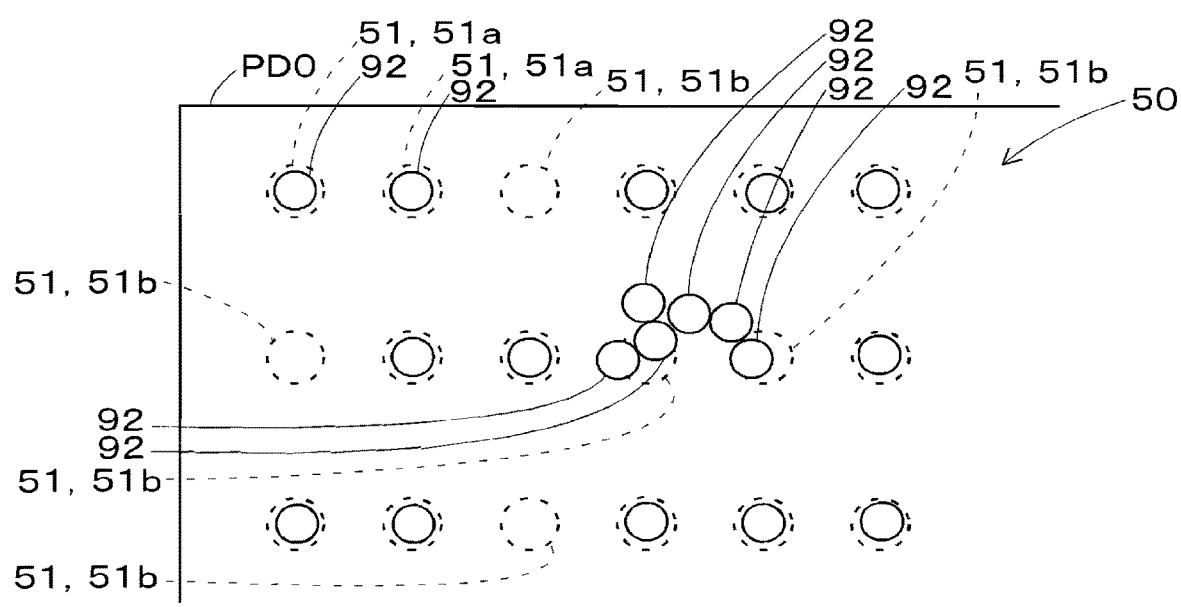
FIG. 10 is a schematic view illustrating an example of image data of a region of a part of the cavity unit.

FIG. 10 illustrates an example of image data PD0 of a part of the region of cavity unit 50. FIG. 10 illustrates an example of the accommodation state of solder balls 92 in 18 cavities 51 in total-three cavities arranged in the conveyance direction of solder balls 92 and six cavities arranged in the width direction of conveyance path Rd0. For convenience of description, leftmost and uppermost cavity 51 in the drawing is defined as cavity 51 in the first row and the first column. For example, as in cavity 51 in the first row and first column, there is cavity 51 in which a specific amount (for example, an area) of the recognition region of solder ball 92 is included in the allowable range of the specific amount of the planned region, and solder ball 92 is appropriately accommodated. In this case, determination section 82 determines that solder ball 92 can be collected by component mounter 10.

There is cavity 51, in which multiple solder balls 92 overlap one cavity 51, such as cavity 51 in the second row and the fourth column and cavity 51 in the second row and the fifth column. In this case, the specific amount (for example, an area) of the recognition region of solder ball 92 is larger than the allowable range of the specific amount of the planned region. In addition, there are cavities 51 in which solder balls 92 are not accommodated, such as cavities 51 in the first row and the third column, cavities 51 in the second row and the first column, and cavities 51 in the third row and the third column. In any of the above cases, determination section 82 determines that solder ball 92 cannot be collected by component mounter 10.

It is good enough if determination section 82 determines whether solder ball 92 can be collected by component mounter 10, and the method of image processing of image data PD0 is not limited. Cavity unit 50 of the present embodiment is colored in a black color (for example, black). In this case, it is easy to recognize white solder ball 92 by binarization processing. Therefore, determination section 82 may perform binarization processing on image data PD0 of cavity unit 50 acquired by imaging section 81 to recognize white solder ball 92, and determine whether solder ball 92 can be collected.

In FIG. 10, for convenience of illustration, cavity unit 50 is illustrated in white. In addition, even in a case where cavity unit 50 is not colored in a black color, determination section 82 can perform binarization processing on image data PD0 of cavity unit 50 to recognize solder ball 92, and determine whether solder ball 92 can be collected. In this case, it is preferable to lower the threshold value of the binarization processing as compared with a case where cavity unit 50 is colored in a black color.

1-3-2. Instruction Section 83 and Conveyance Control Section 84

Instruction section 83 causes component mounter 10 to collect solder ball 92 accommodated in collectable cavity 51*a* that is cavity 51 determined by determination section 82 to be available for collection of solder ball 92 (step S13 illustrated in FIG. 8).

In the example illustrated in FIG. 10, collectable cavity 51*a* includes cavity 51 in which solder ball 92 is appropriately accommodated, such as cavity 51 in the first row and the first column, cavity 51 in the first row and the second column, cavity 51 in the first row and the fourth column, cavity 51 in the first row and the fifth column, and cavity 51 in the first row and the sixth column. Cavities 51 in the second row and the third row also include collectable cavity 51*a*. Instruction section 83 causes component mounter 10 to collect solder balls 92 accommodated in cavities 51.

Specifically, mounting head 13*c* supports, for example, multiple holding members 13*d* (suction nozzles) that can collect (pick up) one solder ball 92. Instruction section 83 causes holding member 13*d* to sequentially collect (pick up) solder balls 92 accommodated in collectable cavity 51*a*. As a result, since component mounter 10 can collect only solder ball 92 accommodated in collectable cavity 51*a*, failure in collecting solder ball 92 is suppressed, and the throughput of component mounter 10 is improved. Solder balls 92 collected by holding member 13*d* are supplied to a predetermined region of board 90. The predetermined region is included in a mounting region of component 91 to be mounted via solder ball 92 such as component 91 of a ball grid array (BGA), for example.

In a case where the number of non-collectable cavities 51*b* that are cavities 51 determined by determination section 82 to be unavailable for collection of solder ball 92 exceeds a predetermined allowable number, conveyance control section 84 changes the conveyance control of multiple solder balls 92 in conveyance path Rd0 (Yes in step S14 and step S15). The control is temporarily ended. In a case where the number of non-collectable cavities 51*b* is equal to or less than the allowable number (No in step S14), the processing illustrated in step S15 is not performed, and the control is temporarily ended.

In the example illustrated in FIG. 10, non-collectable cavity 51*b* includes cavities 51 in which multiple solder balls 92 overlap one cavity 51, such as cavity 51 in the second row and the fourth column and cavity 51 in the second row and the fifth column. When the number of non-collectable cavities 51*b* in which multiple solder balls 92 overlap one cavity 51 exceeds an allowable number, the number of solder balls 92 that can be collected by component mounter 10 becomes smaller than the required number, and the throughput of component mounter 10 may be reduced.

In this case, it is considered that the number of solder balls 92 to be conveyed to cavity unit 50 is larger than an appropriate number. The conveyance control for conveying multiple solder balls 92 in the direction toward cavity unit 50 in conveyance path Rd0 is defined as forward movement conveyance control. At this time, when the time of the forward movement conveyance control is shortened as compared to before the conveyance control is changed, the number of solder balls 92 to be conveyed to cavity unit 50 can be easily reduced. In addition, the conveyance control for conveying multiple solder balls 92 in the direction toward case 70 in conveyance path Rd0 is defined as rearward movement conveyance control. At this time, when the time of the rearward movement conveyance control is extended as compared to before the conveyance control is changed, the number of solder balls 92 to be conveyed to cavity unit 50 can be easily reduced.

Therefore, conveyance control section 84 may change the conveyance control into at least one of the conveyance control for shortening the time of the forward movement conveyance control as compared to before the change and the conveyance control for extending the time of the rearward movement conveyance control as compared to before the change. As a result, solder ball feeder 30 can reduce the number of solder balls 92 to be conveyed to cavity unit 50 as compared to before the conveyance control is changed, and the number of solder balls 92 to be conveyed to cavity unit 50 is optimized.

In addition, in the example illustrated in FIG. 10, non-collectable cavities 51*b* includes cavity 51 in which solder ball 92 is not accommodated, such as cavity 51 in the first row and the third column, cavity 51 in the second row and the first column, and cavity 51 in the third row and the third column. When the number of non-collectable cavities 51*b* in which solder ball 92 is not accommodated exceeds the allowable number, the number of solder balls 92 that can be collected by component mounter 10 becomes smaller than the required number, and the throughput of component mounter 10 may be reduced.

In this case, it is considered that the number of solder balls 92 to be conveyed to cavity unit 50 is less than an appropriate number. When the time of the forward movement conveyance control is extended as compared to before the conveyance control is changed, the number of solder balls 92 to be conveyed to cavity unit 50 can be easily increased. In addition, when the time of the rearward movement conveyance control is shortened as compared to before the conveyance control is changed, the number of solder balls 92 to be conveyed to cavity unit 50 can be easily increased.

Therefore, conveyance control section 84 may change the conveyance control into at least one of the conveyance control for extending the time of the forward movement conveyance control as compared to before the change and the conveyance control for shortening the time of the rearward movement conveyance control as compared to before the change. As a result, solder ball feeder 30 can increase the number of solder balls 92 to be conveyed to cavity unit 50 as compared to before the conveyance control is changed, and the number of solder balls 92 to be conveyed to cavity unit 50 is optimized.

In either case, the allowable number of the non-collectable cavities 51*b* and the increase/decrease ratio of the excitation time can be acquired in advance by, for example, simulation, verification by an actual machine, or the like. For example, when the number of non-collectable cavities 51*b* exceeds a predetermined number, the throughput of component mounter 10 is likely to be reduced. Therefore, the allowable number of non-collectable cavities 51*b* can be set according to the number of non-collectable cavities 51*b* at the time when the throughput of component mounter 10 starts to fall below the allowable value.

In addition, when the maximum number of solder balls 92 to be collected in one pick-and-place cycle cannot be secured by the increase of non-collectable cavities 51b, the throughput of component mounter 10 is likely to be reduced. Therefore, the allowable number of non-collectable cavities 51b can be set according to the number of non-collectable cavities 51b at the time when the maximum number of solder balls 92 to be collected in one pick-and-place cycle cannot be secured.

As described above, excitation device 40 includes forward movement support member 41a, rearward movement support member 41b, forward movement vibrator 42a, and rearward movement vibrator 42b. Forward movement support member 41a is used for the forward movement conveyance control for conveying multiple solder balls 92 in a direction toward cavity unit 50 in conveyance path Rd0 to support track member 34. Rearward movement support member 41b is used for the rearward movement conveyance control for conveying multiple solder balls 92 in a direction toward case 70 in conveyance path Rd0 to support track member 34. Forward movement vibrator 42a is provided in forward movement support member 41a. Rearward movement vibrator 42b is provided in rearward movement support member 41b.

In this mode, conveyance control section 84 can change the conveyance control by increasing or decreasing at least one of the excitation time by forward movement vibrator 42a and the excitation time by rearward movement vibrator 42b as compared to before the change. Specifically, in a case where the conveyance control is changed, in which the time of the forward movement conveyance control is shortened as compared to before the change, conveyance control section 84 shortens the excitation time by forward movement vibrator 42a as compared to before the change. In a case where the conveyance control is changed, in which the time of the rearward movement conveyance control is extended as compared to before the change, conveyance control section 84 causes the excitation time by rearward movement vibrator 42b to be extended as compared to before the change.

In addition, in a case where the conveyance control is changed, in which the time of the forward movement conveyance control is extended as compared to before the change, conveyance control section 84 extends the excitation time by forward movement vibrator 42a as compared to before the change. In a case where the conveyance control is changed, in which the time of the rearward movement conveyance control is shortened as compared to before the change, conveyance control section 84 shortens the excitation time by rearward movement vibrator 42b as compared to before the change.

2. Solder Ball Supply Method

The above description of solder ball supply device 80 also applies to a solder ball supply method. Specifically, the solder ball supply method is applied to solder ball feeder 30 including feeder main body section 31, track member 34, excitation device 40, and cavity unit 50, and includes an imaging process and a determination process. The imaging process corresponds to control performed by imaging section 81. The determination process corresponds to control performed by determination section 82. The solder ball supply method may include an instruction process. The instruction process corresponds to control performed by instruction section 83. The solder ball supply method may also include a conveyance control process. The conveyance control process corresponds to control performed by conveyance control section 84.

3. Example of Effects of Embodiment

According to solder ball supply device 80, it is possible to determine whether solder ball 92 can be collected by component mounter 10 for each of multiple cavities 51, and it is possible to recognize cavity 51 in which solder ball 92 that can be collected by component mounter 10 is accommodated. The above description of solder ball supply device 80 also applies to a solder ball supply method.

REFERENCE SIGNS LIST

10: component mounter, 12: supply device, 12a: slot, 15a: reference portion light source, 15b: incident light converting section, 15c: solder ball light source, 30: solder ball feeder, 31: feeder main body section, 34: track member, 34d: reference portion, 40: excitation device, 41a: forward movement support member, 41b: rearward movement support member, 42a: forward movement vibrator, 42b: rearward movement vibrator, 50: cavity unit, 51: cavity, 51a: collectable cavity, 51b: non-collectable cavity, 70: case, 80: solder ball supply device, 81: imaging section, 82: determination section, 83: instruction section, 84: conveyance control section, 92: solder ball, As0: supply region, Rd0: conveyance path, CU0: imaging device, PD0: image data, Z-axis direction: vertical direction

The invention claimed is:

1. A solder ball supply device applied to a solder ball feeder including
    a feeder main body section,
    a track member configured to be capable of vibrating with respect to the feeder main body section and including a conveyance path through which multiple solder balls discharged from a case are conveyed,
    an excitation device configured to excite the track member to convey the multiple solder balls on the conveyance path to a supply region in which the solder ball is available for collection by a component mounter, and
    a cavity unit including multiple cavities in the supply region, in which one of the multiple solder balls conveyed to the supply region is to be accommodated,
    the solder ball supply device comprising:
    an imaging section configured to cause an imaging device to image the cavity unit to which the multiple solder balls are conveyed;
    a determination section configured to perform image processing on image data of the cavity unit acquired by the imaging section to determine whether a solder ball is available for collection by the component mounter for each of the multiple cavities; and
    a conveyance control section configured to change conveyance control of the multiple solder balls on the conveyance path to the supply region when a number of non-collectable cavities that are the cavities determined by the image processing of the determination section, in which the solder ball is unavailable for collection in the supply region, exceeds an allowable number.

2. The solder ball supply device according to claim 1, further comprising
    an instruction section configured to cause the component mounter to collect the solder ball accommodated in a collectable cavity that is a cavity determined by the determination section, in which the solder ball is available for collection.

3. The solder ball supply device according to claim 1, wherein when the conveyance control for conveying the multiple solder balls in a direction toward the cavity unit in the conveyance path is defined as a forward movement conveyance control, and the conveyance control for conveying the multiple solder balls in a direction toward the case in the conveyance path is defined as a rearward movement conveyance control, in a case where the number of the non-collectable cavities in which the multiple solder balls overlap one cavity exceeds the allowable number, the conveyance control section changes the conveyance control into at least one of the conveyance control for shortening a time of the forward movement conveyance control as compared to before a change and the conveyance control for extending a time of the rearward movement conveyance control as compared to before the change.

4. The solder ball supply device according to claim 1, wherein when the conveyance control for conveying the multiple solder balls in a direction toward the cavity unit in the conveyance path is defined as forward movement conveyance control, and the conveyance control for conveying the multiple solder balls in a direction toward the case in the conveyance path is defined as rearward movement conveyance control, in a case where the number of the non-collectable cavities in which the solder ball is not accommodated exceeds the allowable number, the conveyance control section changes the conveyance control into at least one of the conveyance control for extending a time of the forward movement conveyance control as compared to before a change and the conveyance control for shortening a time of the rearward movement conveyance control as compared to before the change.

5. The solder ball supply device according to claim 1, wherein the excitation device includes
a forward movement support member configured to support the track member used for forward movement conveyance control for conveying the multiple solder balls in a direction toward the cavity unit in the conveyance path,
a rearward movement support member configured to support the track member used for rearward movement conveyance control for conveying the multiple solder balls in a direction toward the case in the conveyance path,
a forward movement vibrator configured to be provided in the forward movement support member, and
a rearward movement vibrator configured to be provided in the rearward movement support member, and the conveyance control section changes the conveyance control by increasing or decreasing at least one of an excitation time by the forward movement vibrator and an excitation time by the rearward movement vibrator as compared to before a change.

6. The solder ball supply device according to claim 1, wherein at least one reference portion used when recognizing positions of the multiple cavities of the cavity unit is provided in the supply region, the imaging device includes
a reference portion light source configured to light the reference portion,
an incident light converting section configured to convert irradiation light irradiated from the reference portion light source into incident light to light the reference portion from above in a vertical direction, and
a solder ball light source configured to light the multiple solder balls of the cavity unit from an obliquely upper side inclined by a predetermined angle with respect to the vertical direction, the imaging section acquires image data of the reference portion imaged by lighting the reference portion by using the reference portion light source and the incident light converting section, and image data of the multiple solder balls imaged by lighting the multiple solder balls by using the solder ball light source, respectively, and the determination section recognizes the multiple solder balls of cavity unit with reference to the reference portion based on the image data of the reference portion and the image data of the multiple solder balls to determine whether the solder ball is available for collection.

7. A solder ball supply device applied to a solder ball feeder including a feeder main body section,
a track member configured to be capable of vibrating with respect to the feeder main body section and including a conveyance path through which multiple solder balls discharged from a case are conveyed,
an excitation device configured to excite the track member to convey the multiple solder balls on the conveyance path to a supply region in which the solder ball is available for collection by a component mounter, and
a cavity unit including multiple cavities in the supply region, in which one of the multiple solder balls conveyed to the supply region is to be accommodated, the solder ball supply device comprising:
an imaging section configured to cause an imaging device to image the cavity unit to which the multiple solder balls are conveyed; and
a determination section configured to perform image processing on image data of the cavity unit acquired by the imaging section to determine whether the solder ball is available for collection by the component mounter for each of the multiple cavities, wherein the cavity unit is colored in a black color, and
the determination section performs binarization processing on image data of the cavity unit acquired by the imaging section to recognize a white solder ball, and determines whether the solder ball is available for collection.

8. The solder ball supply device according to claim 1, wherein the solder ball feeder is provided in a predetermined slot among multiple slots of a supply device of the component mounter.

9. A solder ball supply method applied to a solder ball feeder including a feeder main body section,
a track member configured to be capable of vibrating with respect to the feeder main body section and including a conveyance path through which multiple solder balls discharged from a case are conveyed,
an excitation device configured to excite the track member to convey the multiple solder balls on the conveyance path to a supply region in which the solder ball is available for collection by a component mounter, and a cavity unit including multiple cavities in the supply region, in which one of the multiple solder balls conveyed to the supply region is to be accommodated, the solder ball supply method comprising:

an imaging process of causing an imaging device to image the cavity unit to which the multiple solder balls are conveyed;

a determination process of performing image processing on image data of the cavity unit acquired by the imaging process to determine whether the solder ball is available for collection by the component mounter for each of the multiple cavities; and a conveyance control process for changing conveyance control of the multiple solder balls on the conveyance path to the supply region when a number of non-collectable cavities that are the cavities determined by the image processing, in which the solder ball is unavailable for collection in the supply region, exceeds an allowable number.

* * * * *